(12) United States Patent
Lai

(10) Patent No.: US 8,042,590 B2
(45) Date of Patent: Oct. 25, 2011

(54) PROTECTION MECHANISM FOR DRY FILM LAMINATOR

(75) Inventor: Chin-Sen Lai, Taichung (TW)

(73) Assignee: C Sum Mfg. Ltd., Taichung ( * ) Notice: Subject to any disclaimer, the term of this patent is extended or adjusted under 35 U.S.C. 154(b) by 108 days.

(21) Appl. No.: 12/699,053

(22) Filed: Feb. 3, 2010

(65) Prior Publication Data

US 2011/0186231 A1     Aug. 4, 2011

(51) Int. Cl.
*B32B 37/00* (2006.01)
(52) U.S. Cl. ......... 156/497; 156/537; 156/541; 156/580
(58) Field of Classification Search .......... 156/497, 156/537, 538, 539, 540, 541, 580, 581, 583.1
See application file for complete search history.

(56) References Cited

U.S. PATENT DOCUMENTS

| 6,367,530 | B1* | 4/2002 | Shimotomai | 156/382 |
| 6,451,670 | B1* | 9/2002 | Takisawa et al. | 438/457 |
| 6,481,482 | B1* | 11/2002 | Shimotomai | 156/366 |
| 7,537,670 | B2* | 5/2009 | Takeyama | 156/285 |
| 7,819,165 | B2* | 10/2010 | Hashizume et al. | 156/583.1 |

* cited by examiner

*Primary Examiner* — James Sells

(57) ABSTRACT

A protection mechanism for dry film laminator includes a lower member, and an upper member located above the lower member. The upper member moves downwardly/upwardly relative to the lower member. The upper member has a plurality of through holes defined therein and extending therethrough. An air supply device communicates with the through holes for feeding air into the through holes. A film guide device is disposed above the upper member and includes a supply spool and a take-up spool disposed thereon. A continuous release film movably connected to the film guide device. The continuous release film which is wound on the supply spool is routed from the supply spool to flatly pass between the upper member and the lower member, and is sequentially collected by the take-up spool.

5 Claims, 6 Drawing Sheets

PROTECTION MECHANISM FOR DRY FILM LAMINATOR

BACKGROUND OF THE INVENTION

1. Field of the Invention

The present invention relates to a protection mechanism for dry film laminator, and more particularly to a protection mechanism which removes a material which is extruded from a dry film laminated on a wafer.

2. Description of Related Art

A conventional trimming mechanism for semiconductor wafer in accordance with the prior art comprises a housing, a base received in the housing and horizontally disposed on an inner bottom of the housing, and an upper trimming device received in the housing. The upper trimming device is movably suspended from an inner top of the housing via multiple shafts and is able to move upwardly/downwardly relative to the housing. The upper trimming device includes an annular outer member, an annular inner member, and an annular blade mounted on a bottom thereof. A lower device is received in the housing. The lower device is disposed on a top of the base and corresponds to the upper trimming device for holding a wafer. A supply device is disposed beside the lower device for supplying a protecting film. A take-up device is disposed beside the lower device opposite the supply device for collecting the used protecting film.

When the upper trimming device is operated to move downwardly, the protecting film is laminated on the wafer. The annular blade trims the protecting film around the wafer. However, during trimming, the bleeding resin would not be removed clearly. And afterwards the wafer is moved to another stage for enhancing lamination. The resin may bleed out the wafer again. Therefore, the wafer fabrication may have a low yield.

The present invention has arisen to mitigate and/or obviate the disadvantages of the conventional trimming mechanism for semiconductor wafer.

SUMMARY OF THE INVENTION

The main objective of the present invention is to provide an improved protection mechanism for dry film laminator.

To achieve the objective, the protection mechanism for dry film laminator in accordance with the present invention includes a lower member adapted to be connected to a dry film laminator for holding a wafer, and an upper member adapted to be movably connected to the dry film laminator and located above the lower member. The upper member moves downwardly/upwardly relative to the lower member. The upper member has a plurality of through holes defined therein and extending from a top to a bottom thereof.

An air supply device is adapted to be movably connected to the dry film laminator and disposed on the top of the upper member. The air supply device moves simultaneously with the upper member. The air supply device communicates with the through holes for feeding air into the through holes.

A film guide device is adapted to be connected to the dry film laminator. The film guide device includes a supply spool and a take-up spool parallelly disposed thereon. The film guide device includes a DC motor and a torque motor disposed thereon for respectively driving the supply spool and the take-up spool. The film guide device comprises two rollers respectively disposed on two opposite ends of the bottom of the upper member and corresponding to the supply spool and the take-up spool. The two rollers simultaneously move with the upper member.

A continuous release film is movably connected to the film guide device. The unused continuous release film is wound on the supply spool. The continuous release film is routed from the supply spool to one roller which corresponds to the supply spool. The continuous release film is continuously guided between the upper member and the lower member and rides over the other roller which corresponds to the take-up spool. Sequentially the used continuous release film is collected by the take-up spool. The continuous release film is flatly guided between the upper member and the lower member by the two rollers.

Moreover, a clamping device is movably disposed on two opposite lateral sides of the lower member. When the upper member moves downwardly relative to the lower member and stops slightly above the lower member, the clamping device moves inwardly to firmly hold the upper member and the lower member in place. Followingly, the air supply device feeds air into the through holes to provide air pressure on the continuous release film under the through holes. The continuous release film under the through holes is pressed downwardly against the wafer placed on the lower member. When the air supply device stops feeding air, the continuous release film simultaneously moves from the wafer.

Further benefits and advantages of the present invention will become apparent after a careful reading of the detailed description with appropriate reference to the accompanying drawings.

DETAILED DESCRIPTION OF THE INVENTION

Figure 1:
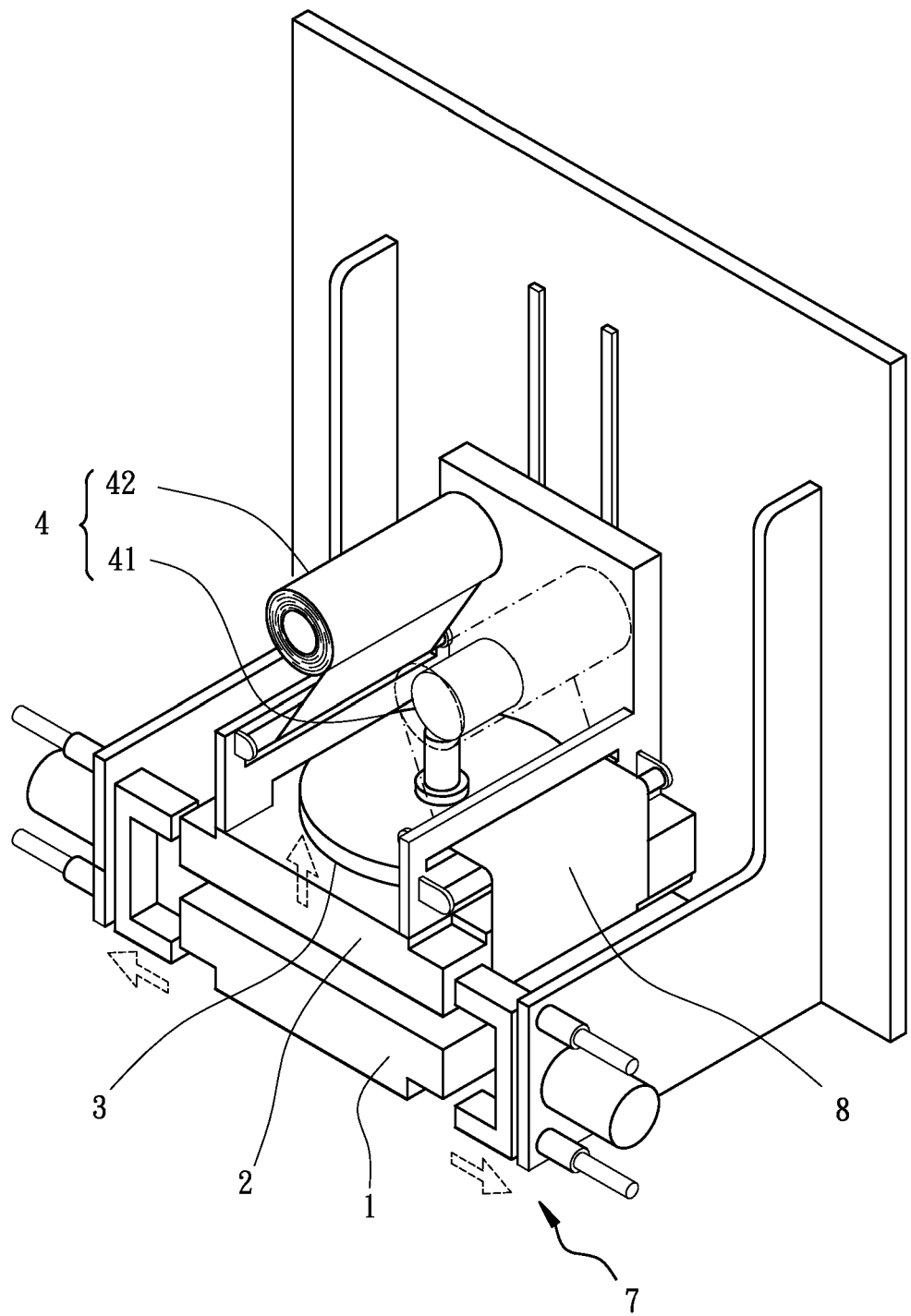
FIG. 1 is a perspective view of a protection mechanism for dry film laminator in accordance with the present invention as an upper member moves upwardly relative to a lower member and a clamping device moves outwardly.
Figure 2:
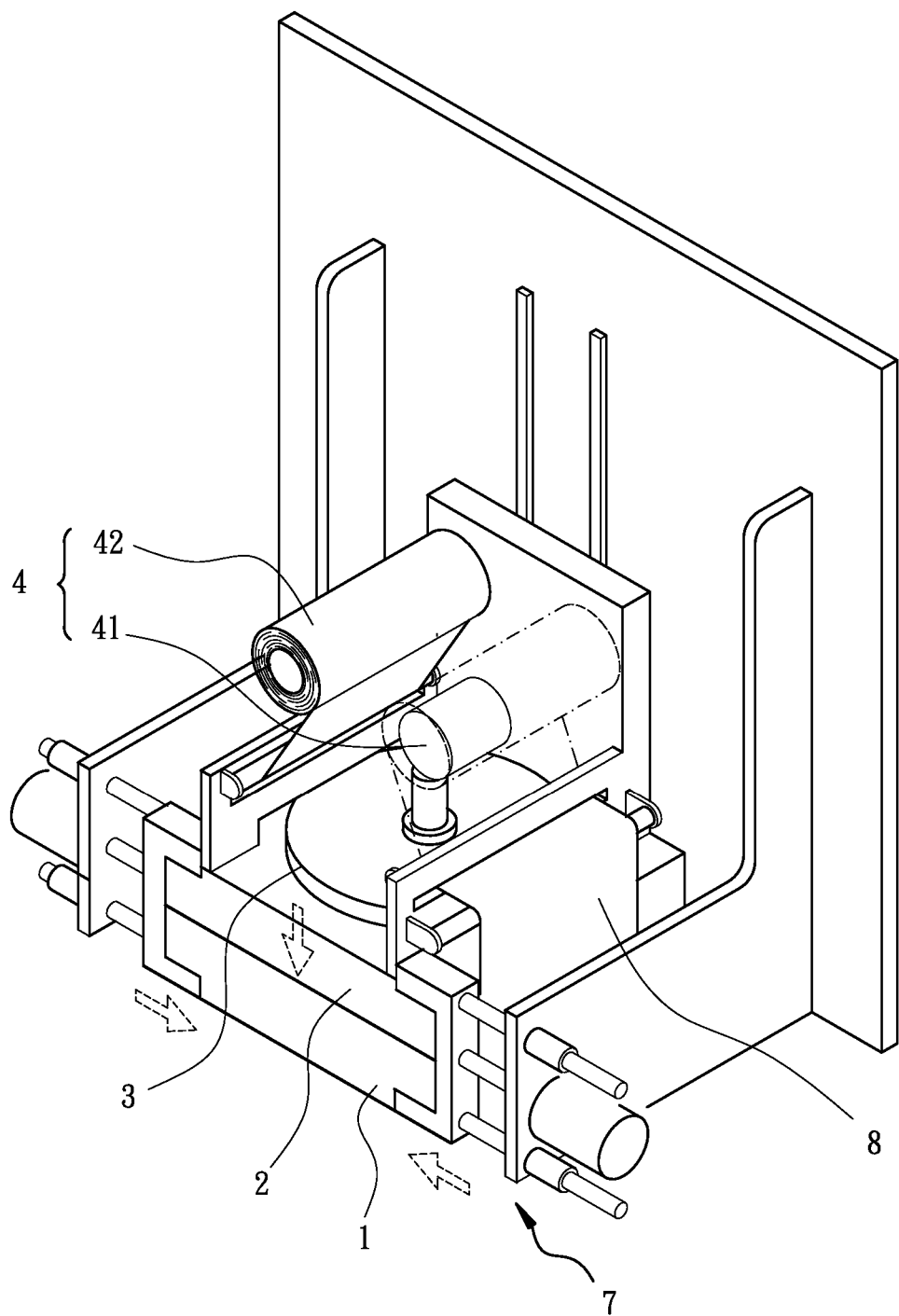
FIG. 2 is a perspective view of the protection mechanism for dry film laminator in accordance with the present invention as the upper member moves downwardly relative to the lower member and the clamping device moves inwardly to firmly hold the upper member and the lower member.
Figure 3:
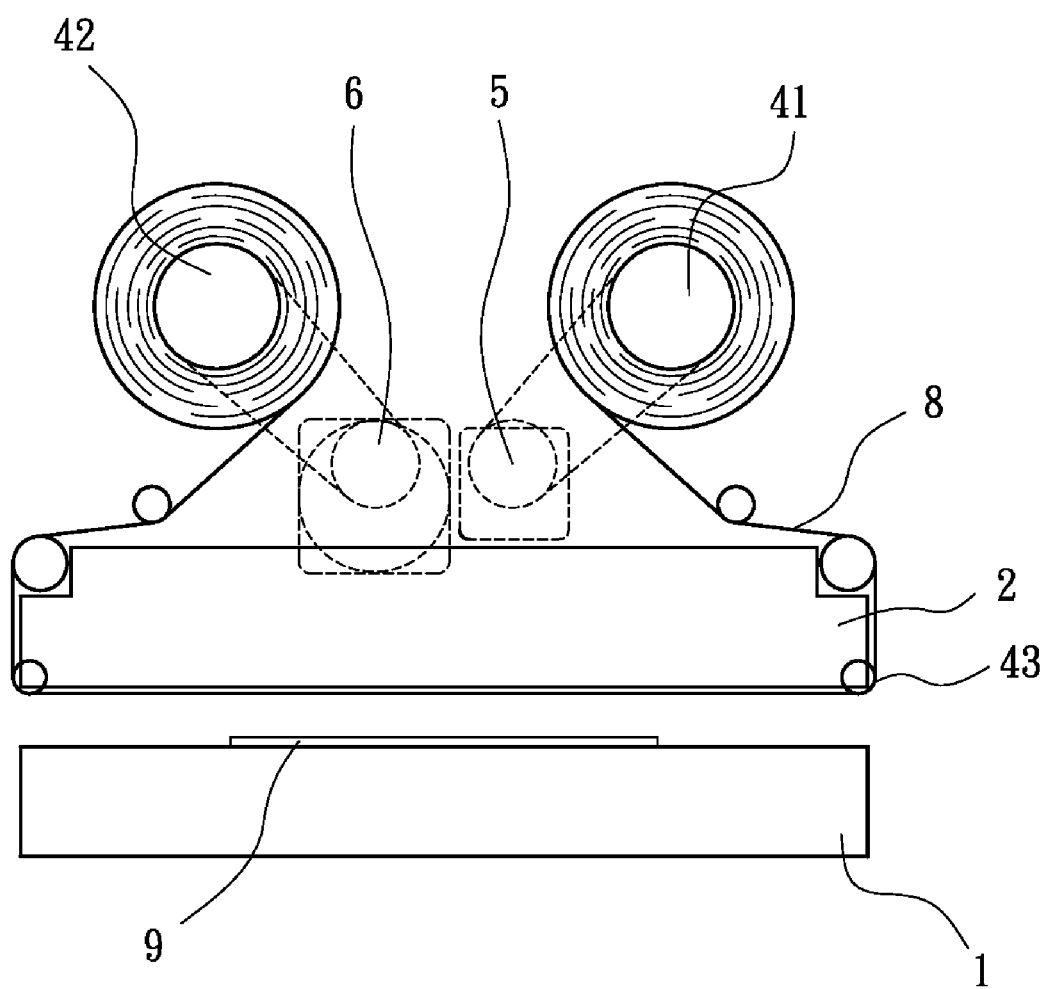
FIGS. 3-7 are operational plane views of the protection mechanism for dry film laminator in accordance with the present invention.

Referring to the drawings and initially to FIGS. 1-2, a protection mechanism for dry film laminator in accordance with the present invention comprises a lower member 1 adapted to be connected to a dry film laminator (not shown). The lower member 1 holds a wafer 9 on a top thereof. The wafer 9 has a dry film 91 (shown in FIGS. 8-10) laminated thereon. An upper member 2 is adapted to be movably connected to the dry film laminator and parallelly located above the lower member 1. The upper member 2 is able to move upwardly/downwardly relative to the lower member 1. The upper member 2 has a plurality of through holes 21 (shown in FIG. 5) defined therein and extending from a top to a bottom thereof.

An air supply device 3 is disposed on the top of the upper member 2 and moves simultaneously with the upper member 2. The air supply device 3 communicates with the through holes 21 for feeding air into the through holes 21.

A film guide device 4 is adapted to be connected to the dry film laminator. The film guide device 4 includes a supply spool 41 and a take-up spool 42 parallelly disposed thereon and located above the upper member 2. The film guide device 4 comprises two rollers 43 (shown in FIGS. 3-7) respectively disposed on two opposite ends of the bottom of the upper member 2 and parallelly corresponding to the supply spool 41 and the take-up spool 42. The two rollers 43 are able to simultaneously move with the upper member 2. The film guide device 4 includes a DC motor 5 and a torque motor 6 (shown in FIGS. 3-7) disposed thereon and located above the upper member 2. The DC motor 5 is connected to the supply spool 41 for driving the supply spool 41. The torque motor 6 is connected to the take-up spool 42 for driving the take-up spool 42.

A continuous release film 8 is movably connected to the film guide device 4. Two ends of the continuous release film 8 are respectively connected to the supply spool 41 and the take-up spool 42. The unused continuous release film 8 is wound on the supply spool 41. When the DC motor 5 drives the supply spool 41 and the torque motor 6 drives the take-up spool 42, the continuous release film 8 is routed from the supply spool 41 to one roller 43 which corresponds to the supply spool 41. The continuous release film 8 is continuously guided between the upper member 2 and the lower member 1 and rides over the other roller 43 which corresponds to the take-up spool 42. Sequentially the continuous release film 8 is collected by the take-up spool 42. The continuous release film 8 is flatly guided between the upper member 2 and the lower member 1 by the two rollers 43.

Moreover, a clamping device 7 is movably disposed on two opposite lateral sides of the lower member 1.

Figure 4:
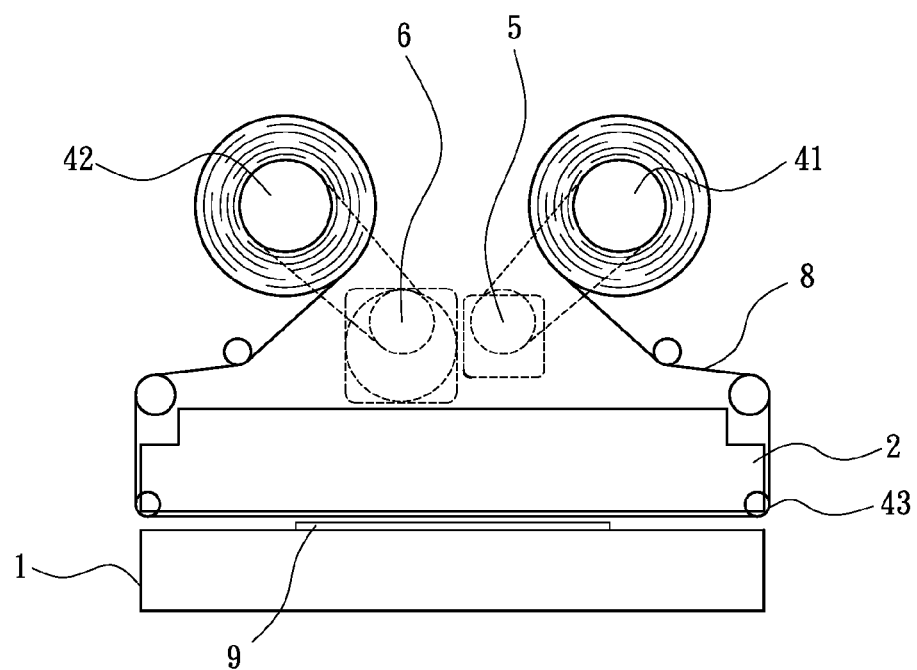
Figure 5:
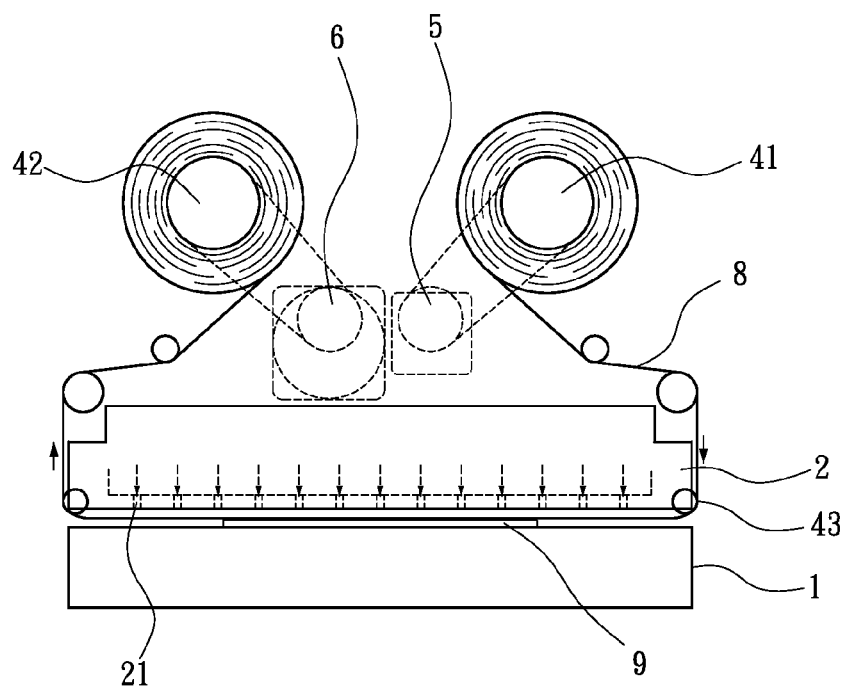
Figure 6:
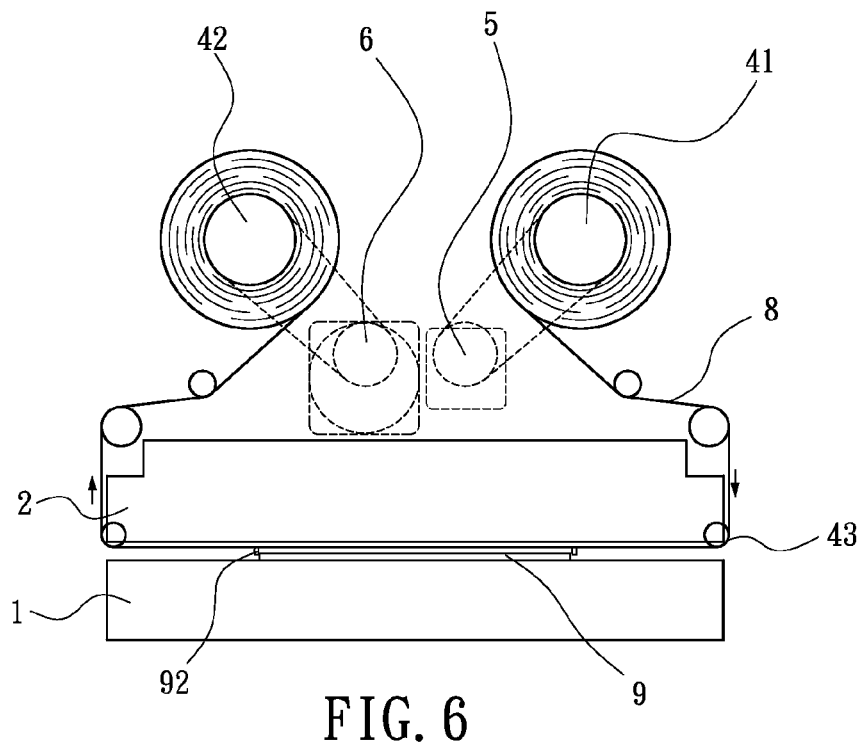
Figure 7:
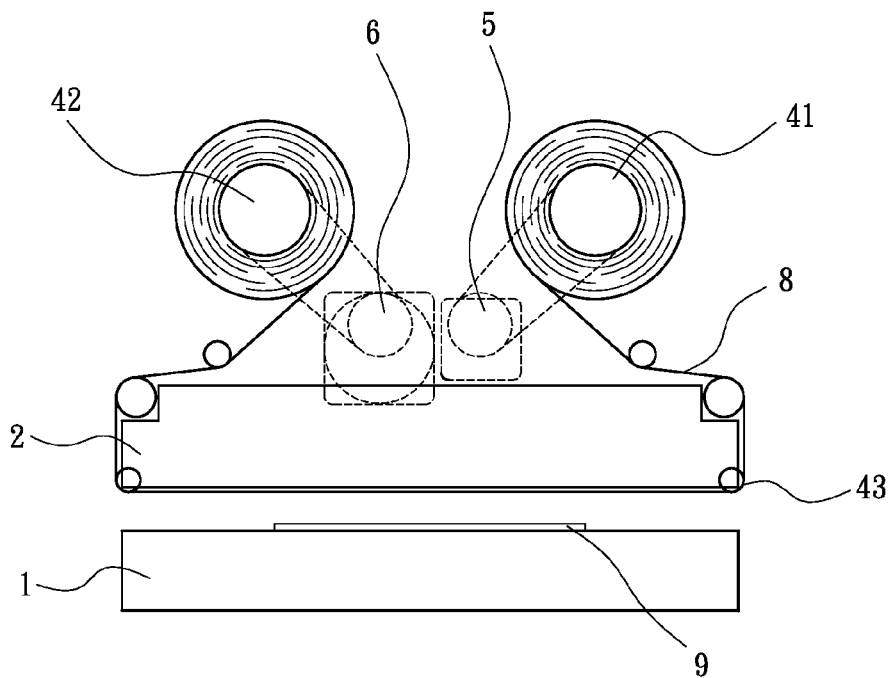
Figure 8:
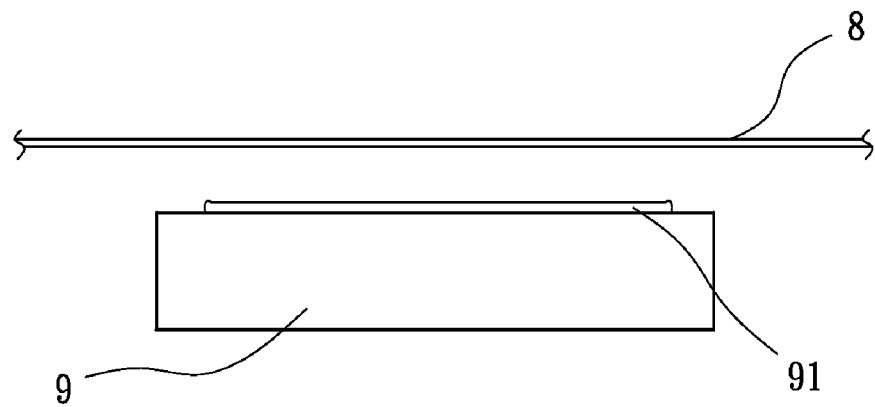
FIGS. 8-10 are partial enlarged plane views of the protection mechanism for dry film laminator in accordance with the present invention in FIGS. 4-6 respectively.
Figure 9:
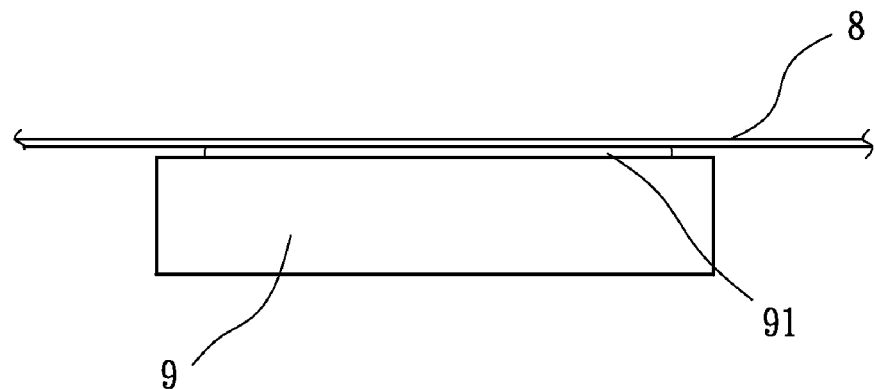
Figure 10:
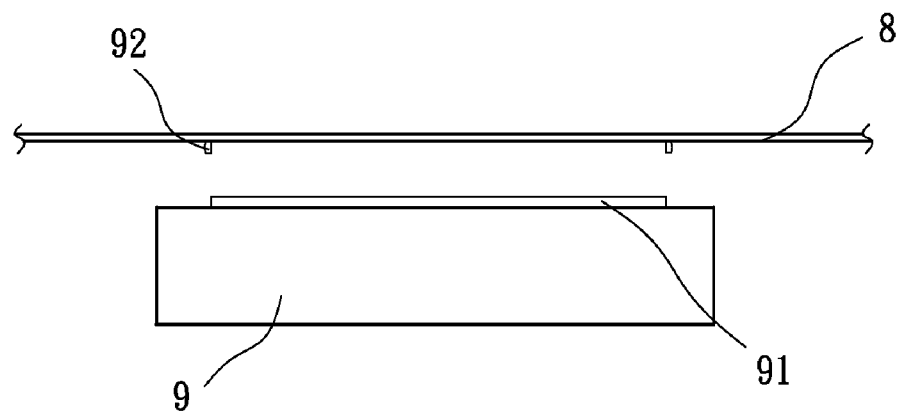

FIGS. 3-7 show the operation of the protection mechanism for dry film laminator in accordance with the present invention, and FIGS. 8-10 respectively show the partial enlarged drawings in FIGS. 4-6. When the upper member 2 moves downwardly relative to the lower member 1 and stops slightly above the lower member 1, the clamping device 7 (shown in FIGS. 1-2) moves inwardly to firmly hold the upper member 2 and the lower member 1 in place. Continuously the DC motor 5 drives the supply spool 41 and the torque motor 6 drives the take-up spool 42. The unused continuous release film 8 is guided from the supply spool 41 and stops between the upper member 2 and the lower member 1.

Afterwards the air supply device 3 feeds air into the through holes 21 to provide air pressure on the continuous release film 8 under the through holes 21. The continuous release film 8 under the through holes 21 is pressed downwardly against the wafer 9 which is placed on the lower member 1 for enhancing a lamination of the dry film 92 to the wafer 9. A photoresist material 92 is extruded out from the dry film 91 and is adhered to the continuous release film 8.

Sequentially, the air supply device 3 stops feeding air and the continuous release film 8 simultaneously moves away from the wafer 9. The continuous release film 8 simultaneously removes the extruded photoresist material 92 from the wafer 9. Followingly, the clamping device 7 (shown in FIGS. 1-2) moves outwardly to release the outer member 2 and the lower member 1. The outer member 2 moves upwardly relative to the lower member 1. The DC motor 5 and the torque motor 6 respectively drives the supply spool 41 and the take-up spool 42 again. The used continuous release film 8 is guided and collected by the take-up spool 42.

Although the invention has been explained in relation to its preferred embodiment, it is to be understood that many other possible modifications and variations can be made without departing from the spirit and scope of the invention as hereinafter claimed.

What is claimed is:

1. A protection mechanism for dry film laminator comprising:
   a lower member adapted to be connected to a dry film laminator for holding a wafer, the wafer adapting to has a dry film laminated thereon;
   an upper member adapted to be movably connected to the dry film laminator and located above the lower member, the upper member moving downwardly/upwardly relative to the lower member, the upper member having a plurality of through holes defined therein and extending from a top to a bottom thereof;
   an air supply device adapted to be movably connected to the dry film laminator and communicating with the through holes for feeding air into the through holes;
   a film guide device adapted to be connected to the dry film laminator, the film guide device including a supply spool and a take-up spool parallelly disposed thereon; and
   a continuous release film movably connected to the film guide device, the unused continuous release film wound on the supply spool and routed from the supply spool to flatly pass between the upper member and the lower member, sequentially the used continuous release film collected by the take-up spool;
   wherein when the upper member moves downwardly relative to the lower member, the air supply device feeds air into the through holes to provide air pressure on the continuous release film under the through holes, the continuous release film under the through holes pressed downwardly against the wafer placed on the lower member for enhancing a lamination of the dry film to the wafer and adhering a material extruded from the dry film; when the air supply device stops feeding air, the continuous release film simultaneously moves from the wafer and removes the extruded material from the wafer.

2. The protection mechanism for dry film laminator as claimed in claim 1, wherein the film guide device comprises two rollers respectively disposed on two opposite ends of the bottom of the upper member and corresponding to the supply spool and the take-up spool for flatly guiding the continuous release film between the upper member and the lower member, the two rollers simultaneously moving with the upper member.

3. The protection mechanism for dry film laminator as claimed in claim 1, wherein the air supply device is disposed on the top of the upper member and moves simultaneously with the upper member.

4. The protection mechanism for dry film laminator as claimed in claim 1, wherein the film guide device includes a DC motor disposed thereon for driving the supply spool and a torque motor disposed thereon for driving the take-up spool.

5. The protection mechanism for dry film laminator as claimed in claim 1 further comprising a clamping device movably disposed on two opposite lateral sides of the lower member, wherein when the upper member moves downwardly and stops slightly above the lower member, the clamping device moves inwardly to firmly hold the upper member and the lower member in place.

* * * * *